United States Patent [19]

Shpigelman

[11] Patent Number: 4,785,936

[45] Date of Patent: Nov. 22, 1988

[54] DEVICE FOR HOLDING FLAT OBJECTS SUCH AS PRINTED CIRCUIT BOARDS

[76] Inventor: David Shpigelman, 1 Mavo Gilat, Ramont Zahala, Tel Aviv, Israel

[21] Appl. No.: 49,731

[22] Filed: May 13, 1987

[51] Int. Cl.⁴ ............................................. B65D 85/48
[52] U.S. Cl. ...................... 206/454; 206/449; 206/560; 206/565; 220/22.1; 220/22.3; 220/22.6; 211/41
[58] Field of Search ............... 206/328, 334, 449, 454, 206/560, 564, 565, 555, 556; 220/22.1-22.6; 211/40, 41, 43

[56] References Cited

U.S. PATENT DOCUMENTS

| | | | |
|---|---|---|---|
| 142,575 | 9/1873 | Martin et al. | 206/560 |
| 182,726 | 9/1876 | Whitman | 220/22.6 |
| 312,835 | 2/1885 | Friedenthal | 206/560 |
| 672,561 | 3/1901 | Loeb | 206/560 |
| 1,289,180 | 12/1918 | Hunter | 220/22.3 |
| 1,979,774 | 11/1934 | Scoville | 220/22.6 |
| 2,793,643 | 5/1957 | Wolters | 220/22.3 |
| 2,953,253 | 9/1960 | Henderson et al. | 211/41 |
| 3,554,381 | 1/1971 | Guest | 220/22.1 |
| 3,951,587 | 4/1976 | Alliegro et al. | 206/564 |

Primary Examiner—David T. Fidei
Attorney, Agent, or Firm—Renner, Otto, Boisselle & Sklar

[57] ABSTRACT

There is described a device for holding flat objects, especially printed circuit boards during their being transported or stored, or being conveyed on an assembling line. The device consists basically of a partly or wholly hollow tray having slits in its upper surface which communicate with the hollows. One or more elongated bodies are insertable into the hollow. Cam members are provided urging the inserted elongated members inwardly of the hollows. The boards are placed on edge in the slits and come to rest on the inserted elongated bodies.

16 Claims, 3 Drawing Sheets

4,785,936

DEVICE FOR HOLDING FLAT OBJECTS SUCH AS PRINTED CIRCUIT BOARDS

FIELD AND BACKGROUND OF THE INVENTION

The present invention relates to a device for holding flat objects and more particularly but not exclusively to a tray like device which is adapted to hold objects such as printed circuit boards and the like both for handling same on the assembling line or for storage in a secured manner.

Printed circuit boards and the like are being used in the electronic industry. Such boards are kept in different positions while on the assembly line, for which reason there are known and are conventionally employed special trays for holding the boards in the proper position for being handled.

These trays are usually made of plastic (or metal) and all provided with slots in the face of the tray in which the boards are placed standing on edge. In this manner the boards are shipped from one location to another on the assembly line or are kept in storage. As not all boards are of the same thickness and sizes, it is quite obvious that these trays must be equipped with means for securing the boards in the slot so as to stabilize same. To this end some of the trays are provided with lateral supports for the boards, a matter which increases the cost of the trays and limits the use of the tray for certain size of boards only.

To overcome that deficiency, additions have been made to the side supports to enable their adjustment. But so far all these trays are not modular and are being used only for certain sizes, thus many configurations and sizes of trays must be kept in the respective factory.

OBJECTS OF THE INVENTION

It is thus an object of the present invention to provide a handling tray for printed circuit boards or the like articles which will have a secure holding and locking means for boards (or whatever other articles of that type).

It is a further object of the invention to provide such a tray on which all sizes of boards could be stored, handled and shipped in a secured position.

It is yet a further object of the invention to provide a tray of simple construction and at low cost.

A further object of the invention is to provide a tray with such locking means for the boards which would permit turning upside down of the tray for various handling purposes.

Finally, it is an object of the invention to provide a multi use try which could be easily stacked or nested when not actually used.

SUMMARY OF THE INVENTION

The tray according to the invention comprises an at least partly hollow tray like body provided with slots in its upper face which communicate with the hollow space(s) in the tray, the said tray body being adapted to receive in hollow space(s) at least one elongate member which is provided with resilient material cushionings, one end of said member abutting against a spring and being urged thereby to one direction while the other end thereof abuts against a cam member adapted to counter-act the spring bias, and means being provided to operate the cam member.

According to one aspect of the invention, a device for holding boards, such as printed circuit boards, or other flat bodies, comprises: a tray including a pair of tubular members and means interconnecting the tubular members in laterally spaced parallel relationship, each the tubular member having plural laterally extending slot means each opening upwardly and laterally aligned with a respective slot means in the other tubular member for receiving the lower edge portion of respective board to be held in the device; a pair of shifting members respectively inserted in and movable longitudinally in the tubular members, each the shifting member having a top surface and plural laterally extending ridges on the top surface; plural resilient means normally interposed longitudinally between respective ones of the ridges and ones of the slots means in the tubular members for resiliently engaging boards received in the slot means to clamp the boards resiliently against back edges of the slot means upon rearward longitudinal shifting of the shifting members in the tubular members, and means for effecting the rearward longitudinal shifting of the shifting members. The tubular members have a top wall and side walls, and the slot means includes laterally extending slits in the top wall and vertical notches in the side walls. Said back edge of each slot means has a first surface portion elongated in a vertical direction and offset laterally with respect to the respective resilient means and a second surface portion elongated in a horizontal direction and extending laterally at least partially coextensively with the resilient means. Said side walls include the first surface portions of the back edges and the top walls include the second surface portions of the back edges. The tray has a top wall and the top wall of the tray includes the top walls of the tubular members and an intermediate wall portion interconnecting the tubular members.

According to another aspect of the invention, a device for holding boards, such as printed circuit boards, or other flat bodies, comprises: a tray including a hollow interior space and upwardly opening slot means extending laterally across the top surface of the tray for receiving the lower edge portions of boards to be held in the device; at least one member inserted in and movable longitudinally in the hollow interior space, the member having a top surface and plural laterally extending ridges on the top surface; plural resilient means normally interposed longitudinally between respective ones of the ridges and ones of the slot means for resiliently engaging boards received in the slot means to clamp the boards resiliently against back edges of the slot means upon rearward longitudinal shifting of the member in the tray, and means for effecting the rearward longitudinal shifting of the member; and the back edges of the slot means having at each side of the tray a first surface portion elongated in a vertical direction and offset laterally with respect to the resilient means and a second surface portion elongated in a horizontal direction and laterally offset with respect to the first surface portion. Said means for effecting includes cam means for urging the members from a position permitting insertion of boards into the slot means to a position engaging the resilient means against boards for clamping of the boards against the back edges of the slot means. Also provided are means for means for resiliently biasing the members forwardly and against the cam means.

According to still another aspect of the invention, a device for holding boards, such as printed circuit boards, or other flat bodies, comprising: a tray including a hollow interior space and upwardly opening slot means extending laterally across the top surface of the tray for receiving the lower edge portions of boards to be held in the device; at least one member inserted in and movable longitudinally in the hollow interior space, the member having a top surface and plural laterally extending ridges on the top surface; plural resilient means normally interposed longitudinally between respective ones of the ridges and ones of the slots means for resiliently engaging boards received in the slot means to clamp the boards resiliently against back edges of the slot means upon rearward longitudinal shifting of the member in the tray, and means for effecting the rearward longitudinal shifting of the member, the means including cam means rotatable between first and second positions, the cam means in the first position permitting movement of the member to a forward position permitting insertion of boards into the slot means, the cam means in the second position urging the member rearwardly to an engagement position to engage the resilient means against the boards thereby resiliently to clamp the boards against the back edges of the slot means, and the engagement position of the member being the same regardless of the thickness of the boards being clamped. The second position of the cam means is an overcenter position of the cam means for locking the member in the engagement position.

BRIEF DESCRIPTION OF THE DRAWINGS

The invention will now be described with reference to the annexed drawings (which are not according to scale) in which.

DESCRIPTION OF PREFERRED EMBODIMENT

Figure 1:
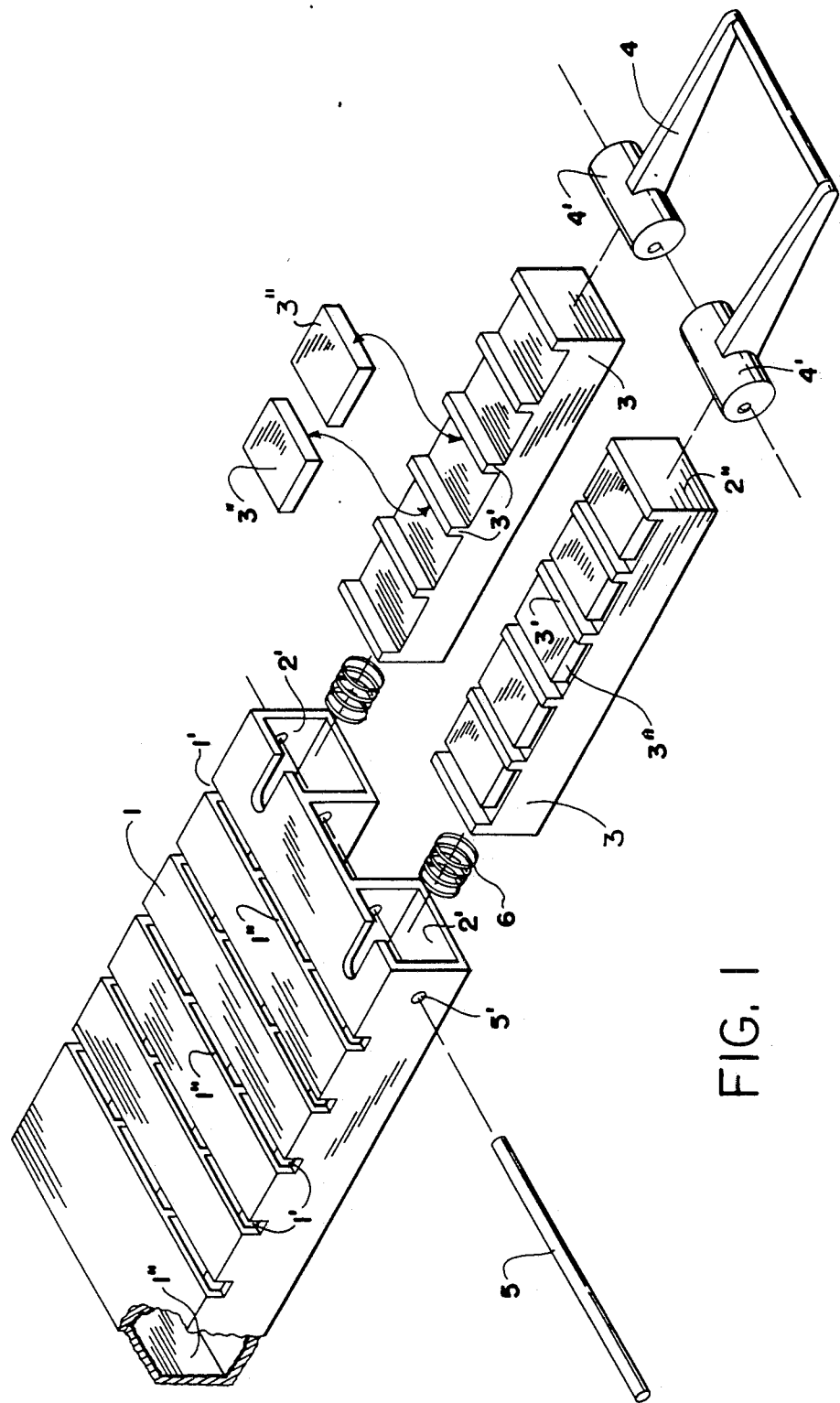
FIG. 1 is a perspective exploded view of the tray and securing means according to the invention.

Turning first to FIG. 1, across the tray body 1 extend slots 1'. The tray body includes hollow spaces 2' into which are inserted two members which are elongated blocks 3 across the upper side of which extend ridges 3' serving as partitions between cushions 3" made of resilient material such as rubber. Before inserting members 3 into the cavities 2', springs 6 are placed therein so as to abut against end inner wall of the cavity 2' and the end face of the member 3. After the insertion of member 3 into the cavity 2', handle 4 which is connected to two cylindrical cam bodies 4' is placed in position being journalled on an axle 5, which is passed through holes 5' in the side wall of body 1. The cylindrical cam members in this position contact the end face 2" of member 3. Also, as best seen in FIG. 2, the cam bodies are eccentrically mounted such that upon counterclockwise rotation the cam bodies will urge the blocks 3 in the direction "y".

Figure 2:
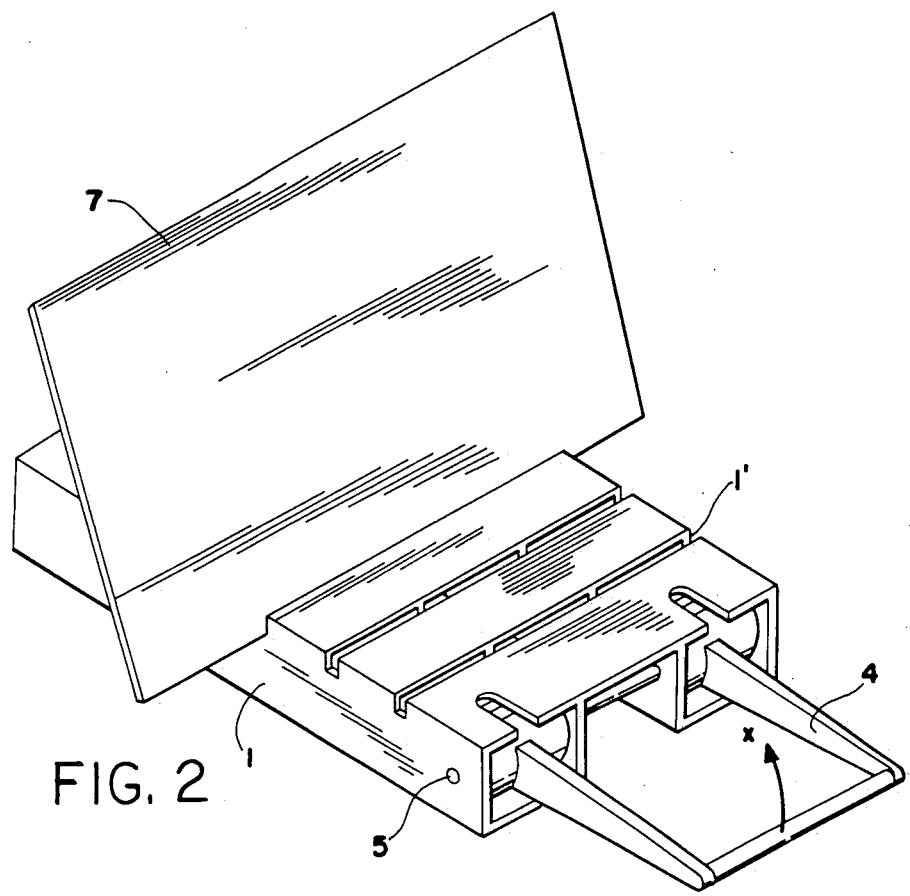
FIG. 2 is a perspective view of the tray with a board in unsecured position.
Figure 3:
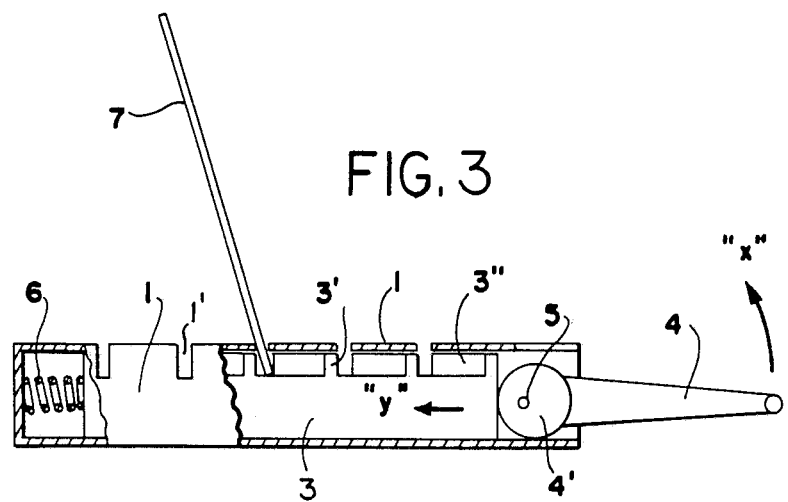
FIG. 3 is an elevational section of the assembly of FIG. 2.
Figure 4:
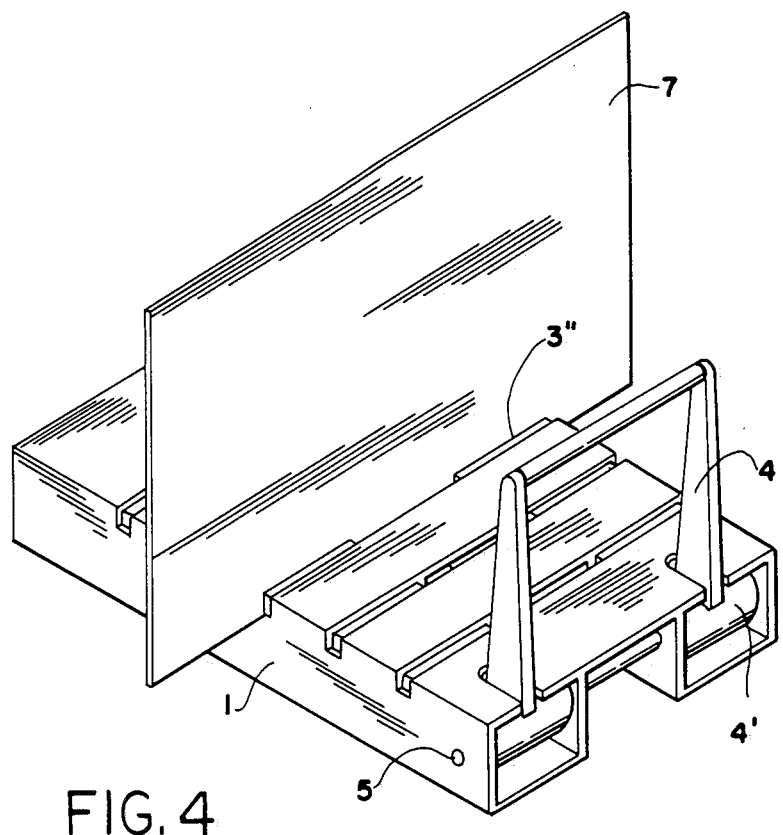
FIG. 4 is a perspective view of the tray with a board in the secured position.
Figure 5:
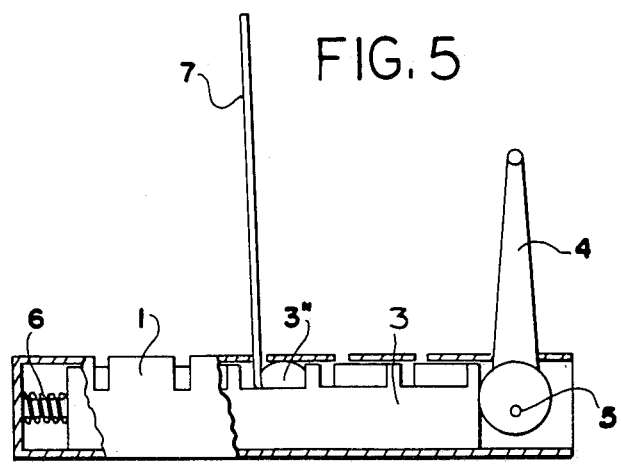
FIG. 5 is an elevational section thereof.

Turning now to FIGS. 2 and 3, a board 7 is placed within a slot 1' and into a gap between a divider 3' of member 3 and a cushioning piece 3". As shown in FIG. 3 the board 7 is not normal to the plane of the tray 1, in fact it is not held securely and is apt to wobble during its travel on a conveyor belt. To remedy this and to stabilize the condition of the board on the tray the handle 4 is swung upwardly as indicated by the arrow "X" in FIG. 3. This causes the block members 3 to be displaced in their longitudinal direction, thereby narrowing the gaps between edge 1" of slot 1' and the nearest cushioning piece 3". As a result the respective board (or boards) is (or are) righted to stand on edge substantially normal to the bottom of the tray and at the same time are firmly clamped between the edge 1" and the cushioning piece 3". The board is prevented from tilting towards the far end of the tray body being held when it arrives in a position normal to the plane of the tray body by having an edge of the board extending into a cut-out 13 in longitudinal ridge extending the length of the tray body.

It will be seen that by the use of trays as described circuit boards (or any other plate shaped bodies) can be made to be securely held on the tray, both during transport and at storage.

What is claimed is:

1. A device for holding boards, such as printed circuit boards, or other flat bodies, comprising:

a tray including a pair of tubular members and means interconnecting said tubular members in laterally spaced parallel relationship, each said tubular member having plural laterally extending slot means each opening upwardly and laterally aligned with a respective slot means in the other tubular member for receiving the lower edge portion of respective board to be held in the device;

a pair of shifting members respectively inserted in and movable longitudinally in said tubular members, each said shifting member having a top surface and plural laterally extending ridges on the top surface;

plural resilient means normally interposed longitudinally between respective ones of said ridges and ones of said slot means in said tubular members for resiliently engaging boards received in said slot means to clamp the boards resiliently against back edges of said slot means upon rearward longitudinal shifting of said shifting members in said tubular members, and means for effecting said rearward longitudinal shifting of said shifting members.

2. A device as set forth in claim 1, wherein said tubular members have a top wall and side walls, and said slot means includes laterally extending slits in said top wall and vertical notches in said side walls.

3. A device as set forth 2, wherein said back edge of each slot means has a first surface portion elongated in a vertical direction and offset laterally with respect to the respective resilient means and a second surface portion elongated in a horizontal direction and extending laterally at least partially coextensively with said resilient means.

4. A device as set forth in claim 3, wherein said side walls include said first surface portions of said back edges and said top walls include said second surface portions of said back edges.

5. A device as set forth in claim 2, wherein said tray has a top wall and said top wall of said tray includes said top walls of said tubular members and an intermediate wall portion interconnecting said tubular members.

6. A device as set forth in claim 1, wherein said means for effecting includes cam means for urging said shifting members from a position permitting insertion of boards into said slot means to a position engaging said resilient means against boards for clamping of the boards against the back edges of said slot means.

7. A device as set forth in claim 6, including means for resiliently biasing said shifting members forwardly and against said cam means.

8. A device as set forth in claim 7, wherein said cam means is pinned to said tray and functions to retain said shifting members and resilient means assembled within the tray.

9. A device for holding boards, such as printed circuit boards, or other flat bodies, comprising:
- a tray including a hollow interior space and upwardly opening slot means extending laterally across the top surface of said tray for receiving the lower edge portions of boards to be held in the device;
- at least one member inserted in and movable longitudinally in said hollow interior space, said member having a top surface and plural laterally extending ridges on the top surface;
- plural resilient means normally interposed longitudinally between respective ones of said ridges and ones of said slots means for resiliently engaging boards received in said slot means to clamp the boards resiliently against back edges of said slot means upon rearward longitudinally shifting of said member in said tray, and
- means for effecting said rearward longitudinal shifting of said member; and
- said back edges of said slot means having at each side of said tray a first surface portion elongated in a vertical direction and offset laterally with respect to said resilient means and a second surface portion elongated in a horizontal direction and laterally offset with respect to said first surface portion.

10. A device as set forth in claim 9, wherein said means for effecting includes cam means for urging said members from a position permitting insertion of boards into said slot means to a position engaging said resilient means against boards for clamping of the boards against the back edges of said slot means.

11. A device as set forth in claim 10, including means for resiliently biasing said members forwardly and against said cam means.

12. A device for holding boards, such as printed circuit boards, or other flat bodies, comprising:
- a tray including a hollow interior space and upwardly opening slot means extending laterally across the top surface of said tray for receiving the lower edge portions of boards to be held in the device;
- at least one member inserted in and movable longitudinally in said hollow interior space, said member having a top surface and plural laterally extending ridges on the top surface;
- plural resilient means normally interposed longitudinally between respective ones of said ridges and ones of said slots means for resiliently engaging boards received in said slot means to clamp the boards resiliently against back edges of said slot means upon rearward longitudinal shifting of said member in said tray, and
- means for effecting said rearward longitudinal shifting of said member, said means including cam means rotatable between first and second positions, said cam means in said first position permitting movement of said member to a forward position permitting insertion of boards into said slot means, said cam means in said second position uring said member rearwardly to an engagement position to engage said resilient means against the boards thereby resiliently to clamp the boards against the back edges of said slot means, and said engagement position of said member being the same regardless of the thickness of the boards being clamped.

13. A device as set forth in claim 12, wherein said second position of said cam means is an overcenter position of said cam means for locking said member in said engagement position.

14. A device as set forth in claim 12, wherein said back edges of said slot means have at each side of said tray a first surface portion elongated in a vertical direction and offset laterally with respect to said resilient means and a second surface portion elongated in a horizontal direction and laterally offset with respect to said first surface portion.

15. A device as set forth in claim 2, wherein said plural resilient means are captured between the top surfaces of said shifting members and the bottom surfaces of the top walls of said tubular members.

16. A device as set forth in claim 15, wherein each said plural resilient means includes a cushion made of resilient material.

* * * * *